(12) United States Patent
Hirata et al.

(10) Patent No.: US 6,418,032 B2
(45) Date of Patent: Jul. 9, 2002

(54) PRINTED WIRING BOARD

(75) Inventors: Masayuki Hirata, Niiza; Osamu Ueno, Hadano, both of (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/800,582

(22) Filed: Mar. 8, 2001

(30) Foreign Application Priority Data

Mar. 14, 2000 (JP) ........................................ 2000-071348

(51) Int. Cl.[7] .............................. H05K 1/11; H05K 1/14
(52) U.S. Cl. ........................ 361/780; 361/792; 361/794; 361/795
(58) Field of Search .................. 361/760–763, 361/766–767, 780–784, 792–795, 822, 818, 748; 174/260; 333/12, 185, 246–247; 257/728

(56) References Cited

U.S. PATENT DOCUMENTS

| 5,016,085 | A | * | 5/1991 | Hubbard et al. | ............... | 357/74 |
| 5,068,631 | A | * | 11/1991 | Vince | ......................... | 333/181 |
| 5,488,540 | A | * | 1/1996 | Hatta | .......................... | 361/794 |
| 5,764,491 | A | * | 6/1998 | Tran | ............................ | 361/794 |
| 5,768,109 | A | * | 6/1998 | Gulick et al. | ................ | 361/794 |
| 5,847,451 | A | * | 12/1998 | Ohtaki et al. | ................ | 257/697 |
| 6,166,457 | A | * | 12/2000 | Iguchi et al. | .................. | 307/91 |
| 6,297,965 | B1 | * | 10/2001 | Sasaki et al. | ................ | 361/782 |

FOREIGN PATENT DOCUMENTS

| JP | 5-13909 | 1/1993 |
| JP | 07-045962 | 2/1995 |
| JP | 07-154076 | 6/1995 |
| JP | 10-303568 | 11/1998 |

* cited by examiner

Primary Examiner—David S. Martin
Assistant Examiner—Dameon E. Levi
(74) Attorney, Agent, or Firm—Oliff & Berridge, PLC

(57) ABSTRACT

A printed wiring board in which noise components at a high frequency side of a power supply voltage can be eliminated, and undesired radiation noise which is newly generated can be suppressed, such that noise can be greatly reduced overall. The printed wiring board includes a first signal layer, a GND layer, a power source layer and a second signal layer. A sub-power source layer is provided on a same layer as a main power source layer. The sub-power source layer is formed in a substantially oval shape at a predetermined position in a substantially oval opening in the main power source layer, such that it is not in direct contact with the main power source layer. Power supply voltage is supplied from the main power source layer through an L-type filter.

21 Claims, 12 Drawing Sheets

PRINTED WIRING BOARD

BACKGROUND OF THE INVENTION

1. Field of the Invention

The present invention relates to a printed wiring board, and more particularly to a multi-layered printed wiring board having, inside of a substrate, a power source layer (power source layers) for supplying electric power to a semiconductor device.

2. Description of the Related Art

Conventionally, undesirable electromagnetic wave noise generated inside an electric or electronic device or external noise entering from the outside into an electric or electronic device has been a serious problem for electric and electronic devices. For this reason, electromagnetic compatibility (EMC) design is necessary in order to prevent undesirable electromagnetic wave noise from being generated inside the electric and electronic devices and to secure strength against external noise.

In recent electric and electronic devices, digitization of their electronic circuits and acceleration of the processing speed have been achieved. Accompanying this trend, electromagnetic noise has also increased rapidly. Further, due to the rapid increase in use of cellular phones, external noise has also increased. For this reason, EMC design has becomes technically difficult.

Particularly, a source of electromagnetic wave noise recently considered to be an important problem is noise current, which flows into a power source layer inside a substrate from a power supply circuit for supplying electric power to the semiconductor device when switching the semiconductor device which is disposed on the substrate.

According to Japanese Patent Application Laid Open (JP-A) No. 5-13909, a circuit board having a main power plane, a ground system, a very large scale integrated device and a sub-power plane has been proposed in order to suppress such noise current. As shown in FIG. 12, a main power plane 60 and a sub-power plane 62, which is physically separated from the main power plane 60 and which is supplied with electric power from the main power plane 60 through a filter 64, are provided as power source layers. The sub-power plane 62 is disposed just below a very large scale integrated device 70 and supplies electric power to the very large scale integrated device 70.

In the same way as the aforementioned JP-A No. 5-13909, in the multi-layered printed wiring board proposed in JP-A No. 7-45962 which has a power source layer and a ground layer as the inner layers, the power source layer region, which is a connecting region of mounted components, and the ground layer region are separated and isolated from each other so as to prevent noise from being spread around.

However, although these prior art are effective for reducing radiation of low-frequency noise of not more than around 500 MHz which is generated from a circuit substrate when supplying electric power to the semiconductor device, it has been found that the radiation of high-frequency noise of about 1 GHz is great, or cannot be reduced.

SUMMARY OF THE INVENTION

An object of the present invention is to provide a printed wiring board capable of suppressing not only radiation of low-frequency noise but also radiation of high-frequency noise, so that undesirable radiation noise which is newly generated can be kept to a low level, thereby reducing noise to a large extent overall.

To achieve the above object, according to a first aspect of the invention, there is provided a printed wiring board for supplying electric power from an external power source to a semiconductor device, wherein the semiconductor device has a plurality of input power supply terminals for inputting substantially equal voltages to the semiconductor device, the printed wiring board comprising:

(a) a plurality of layers, the layers including:
  (i) a mounting face having a plurality of electrical terminals, the mounting face being adapted for mounting the semiconductor device thereto with the plurality of semiconductor device power supply terminals electrically connected to the mounting face electrical terminals; and
  (ii) another layer having a first power source region adapted for connection to the external power source; and (b) a second power source region having an outer configuration smaller than an outer configuration of the semiconductor device, electrically insulated from the first power source region except through an electrical connection through a filter, and electrically connected to the mounting face electrical terminals for supplying electrical power received from the first power source region through the filter, to the semiconductor device.

According to the first aspect of the present invention, the second power source region for supplying electric power to a semiconductor device having plural input power supply terminals, to which the same voltages are inputted, is provided independently of the first power source region. As a result, low-frequency noise components of electric power supplied from the outside can be reduced, further, because the outer configuration of the second power source region is smaller than the outer configuration of a device to be mounted on the mounting face, high-frequency noise radiated from the second power source region can be suppressed to a low level.

Therefore, the radiation noise on the whole can be reduced to an extremely low level. The semiconductor device may be, for example, an integrated circuit component such as an LSI or a ULSI. The "semiconductor device having plural input power supply terminals to which the same voltages are inputted" in the present invention means a semiconductor device having a set of plural input power supply terminals or plural sets of the plural input power supply terminals.

An effect of the present invention arises because the second power source region is smaller than an outer configuration of the semiconductor device. If the semiconductor device to be mounted is an integrated circuit component having a semiconductor chip or a die incorporating an integrated circuit, it is preferable that the second power source region is substantially as large as an area of the semiconductor chip contained in the integrated circuit component. Further, the second power source region may be rectangular, or may be a shape having roundness such as an oval, a circle or a rectangle having rounded corners. A shape having roundness can reduce radiation of noise correspondingly to the absence of angular corners.

Further, a single second power source region may be provided, or plural second power source region may be provided. Namely, one second power source region may be provided so as to correspond to one semiconductor device mounted on the mounting surface, or plural second power source regions may be provided so as to correspond to one semiconductor device mounted on the mounting surface.

For example, if plural function cells such as transistors or diodes are provided on a semiconductor chip within a semiconductor integrated circuit component selling as a semiconductor component, plural second power source regions can be provided electrically independently of one another such that one second power source region corresponds to one function cell or to plural function cells. Further, the second power source region for supplying electric power for the I/O of the semiconductor device and the second power source region for supplying electric power for the core may be provided separately.

Further, the first power source region and the second power source region may be formed on separate layers or on the same layer. If the first power source region and the second power source region are formed on the same layer, the effect of radiation noise reduction is more considerable than when they are formed on separate layers.

If the first power source region and the second power source region are formed on the same layer, the first power source region and the second power source region may be provided so as to be side by side, or the first power source region may be provided with an opening and then the second power source region may be provided within the opening such that it is not in direct contact with the first power source region.

As for the electrical connection between the semiconductor device and the second power source region, if plural external connecting terminals are provided on a rear face of the package like a ball grid array type semiconductor device, at the external connecting terminals may be connected directly to via holes for connecting to the second power source region. Or, in the case of a semiconductor device in which the external connecting terminals are provided along the periphery of the package, pins of the semiconductor device may be connected to the auxiliary wires, ones of ends of which are connected to the second power source region.

Preferably, the printed wiring board, wherein the second power source region is included in one of the layers, another layer includes auxiliary wires which supply electrical power received from the second power source region to the mounting face electrical terminals, first electrical connections connecting the second power source region to the auxiliary wires, second electrical connection connecting the plurality of input power supply terminals and auxiliary wires to one another, and an electromagnetic field separating portion through which at least one of the first and second electrical connections extends.

In other words, if the electromagnetic field separating portion is provided at least in the first interval, i.e., if the electromagnetic field separating portion is provided at least between the auxiliary wires and the second power source region, the electromagnetic field generated by the auxiliary wires and the electromagnetic field generated by the second power source region are separated. Consequently, the second power source region and the auxiliary wires are integrated with each other electromagnetically, so as to suppress radiation of noise.

The electromagnetic field separating portion provided in the first interval acts to separate the electromagnetic field generated by the second power source region and the electromagnetic field generated by the semiconductor device. Further, the second power source region and the semiconductor part are integrated electromagnetically so as to suppress radiation of noise. Of course, if an electromagnetic field separating portion is provided both in the first interval and the second interval, the second power source region and the semiconductor device are separated electromagnetically in two stages, so that a more marked effect can be obtained.

The electromagnetic field separating portion may be formed by a layer connecting member such as a via hole for connecting the auxiliary wires to the second power source region, or a layer connecting member such as a via hole for connecting the auxiliary wires to the semiconductor device.

Preferably, the printed wiring board, wherein the plurality of layers includes a ground layer forming a part of the electromagnetic field separating portion, and said at least one of the electrical connections extends through the ground layer.

That is, the sectional area of the via hole is very small as compared to the area of the second power source region. Thus, it is difficult for high-frequency noise components to pass through the via hole, and the via hole (layer connecting member) plays the role of inductor L.

If the first power source region and the second power source region are formed on the same layer, the reason why high-frequency noise components increase or cannot be reduced is that radiation noise leaks from the periphery of an annular slot specified by an opening formed in the first power source region and the periphery of the second power source region, because the second power source region is provided independently of the first power source region. It is noted that radiation noise increases as the site of the annular slot increases. Thus, the printed wiring board, wherein the layer having the first power source region also includes the second power source region, and the first power source region has an opening with an area less than the semiconductor device, and the second power source region is located in the opening.

That is, by decreasing the opening area of the first power source region to reduce the length of the periphery of the annular slot, radiation noise leaking from the periphery of the annular slot is prevented from becoming large. As compared to a case where the opening area is larger than the mounting face for the semiconductor device, the area of the annular slot is small, thereby making it possible to reduce generation of radiation noise. Because the second power source region is provided in an opening smaller than the outer configuration of the semiconductor device to be mounted on the mounting face, the area of the second power source region is smaller than the mounting face. As a result, noise radiated from the second power source region can be kept to a low level.

Preferably, the printed wiring board, wherein the auxiliary wires are included on the mounting face.

In case where the semiconductor device to be mounted is a ball grid array semiconductor device, the auxiliary wires are provided to be connected to a predetermined number of electrode pads among the electrode pads which are disposed two-dimensionally on the mounting face. With such a structure, the necessity of forming the auxiliary wires while avoiding the electrode pads and via holes is eliminated, thereby facilitating the wiring design. Consequently, the aforementioned effects can be obtained stably.

Further, by providing the auxiliary wires with capacitors at one end or both ends thereof, high-frequency current can be supplied stably, thereby suppressing generation of electromagnetic field noise from the semiconductor device.

Examples of the filter portion for reducing noise generated from electric power from the first power source region include an L-type filter, a π-type filter and an inductor L. The inductor L contained in the L-type filter, the π-type filter and the inductor L may be an inductor having only a reactance component, or may be a ferrite chip inductor having a resistance component may be used. The ferrite chip inductor results in a more marked noise reduction effect.

The filter portion may include: the printed wiring board of the first aspect, wherein the filter includes: a connecting portion connecting the first power source region and the second power source region to one another; and a narrow conductive path formed in the first power source region by a groove pattern for introducing electric power from the first power source region to the connecting portion. In this case, because the filter portion is formed in a portion of the first power source region, an additional part does not have to be provided as the filter portion. Therefore, the space for providing the filter portion becomes unnecessary. Consequently, the structure can be simplified and the cost for the filter portion can be eliminated.

Further, to achieve the above object, according to a second aspect of the present invention, there is provided a printed wiring board comprising: a printed wiring board for supplying power from a power source to an integrated circuit component, wherein the integrated circuit component includes a plurality of input power supply terminals for inputting substantially equal voltages thereto, the printed wiring board comprising a substrate including:

a mounting surface having electrical contacts, and adapted for receiving the integrated circuit component on the mounting surface, with the power supply input terminals of the integrated circuit component electrically connecting to the mounting surface electrical contacts;

a first power source region having an opening of an area less than the integrated circuit component;

at least one second power source region provided in the opening independent from the first power source region, with the second power source region connected through a filter portion to the first power source region;

a ground layer; and auxiliary wires provided on the mounting surface, each auxiliary wire having opposite ends with one end connected to the mounting surface electrical contacts, and the other end connected to the second power source region through a layer connecting member passing through the ground layer.

With such a structure, not only can low-frequency noise radiation be reduced for the above-described reason, but also, high-frequency noise radiated from the second power source region can be kept law. Further, because the integrated circuit component and the second power source region can be electrically separated from each other, the second power source region and the integrated circuit component are integrated with each other electromagnetically so as to prevent radiation of noise.

Further, radiation noise leaking from the periphery of the annular slot is prevented from becoming large. Because the area of the annular slot is smaller than a case where the opening area is larger than the mounting face for the integrated circuit component, the radiation noise can be reduced. Because the current loop formed by the second power source region, the auxiliary wires and the integrated circuit component is the smallest, the radiation noise can be suppressed to a low level.

Further, to achieve the above object, according to another aspect of the invention, it is provided a method of reducing electromagnetic noise introduced into a semiconductor device from a power source for the semiconductor device, the method comprising the steps of:

(a) forming a power supply layer having a first power source region surrounding a second power source region electrically isolated from the first power source region, with the second power region having an area smaller than that of the semiconductor device;

(b) supplying power to the first power source region, and from the first power region to the second power region through a filter;

(c) mounting the semiconductor device over the power supply layer with a ground layer disposed between the semiconductor device and the power supply layer; and (d) supplying power to the semiconductor device through electrical connections extending from the second power source region through the ground layer to the semiconductor device.

DESCRIPTION OF THE PREFERRED EMBODIMENTS

Hereinafter, preferred embodiments of the printed wiring board according to the present invention will be described with reference to the accompanying drawings. In the first embodiment through the third embodiment, a quad flat package (QFP) type IC 30 is used as a semiconductor device which is mounted on the printed wiring board. In the fourth embodiment, a ball grid array (BGA) type IC 31 is used as the semiconductor device.

The present embodiment describes a case in which the printed wiring board is a four-layer substrate formed a front surface (face on which the IC is to be mounted) and a rear face of the printed wiring board are each a signal layer, and a power source layer and a ground layer (hereinafter referred to as GND layer) each composed of copper foil are provided as inner layers. Of course, the present invention may be applied to not only four-layer substrates but also to six-layer substrates and eight-layer substrates or the like. Although generally, the IC has a large number of power supply terminals, ground terminals and signal terminals, only the connecting structure of the power supply terminals will be described for convenience in the respective embodiments. In FIGS. 1, 4, 5, 7, 8 and 9, a black circle indicates that there is a connected state in a layer and a white circle indicates that there is a non-connected state in the layer.

(First Embodiment)

Figure 1:
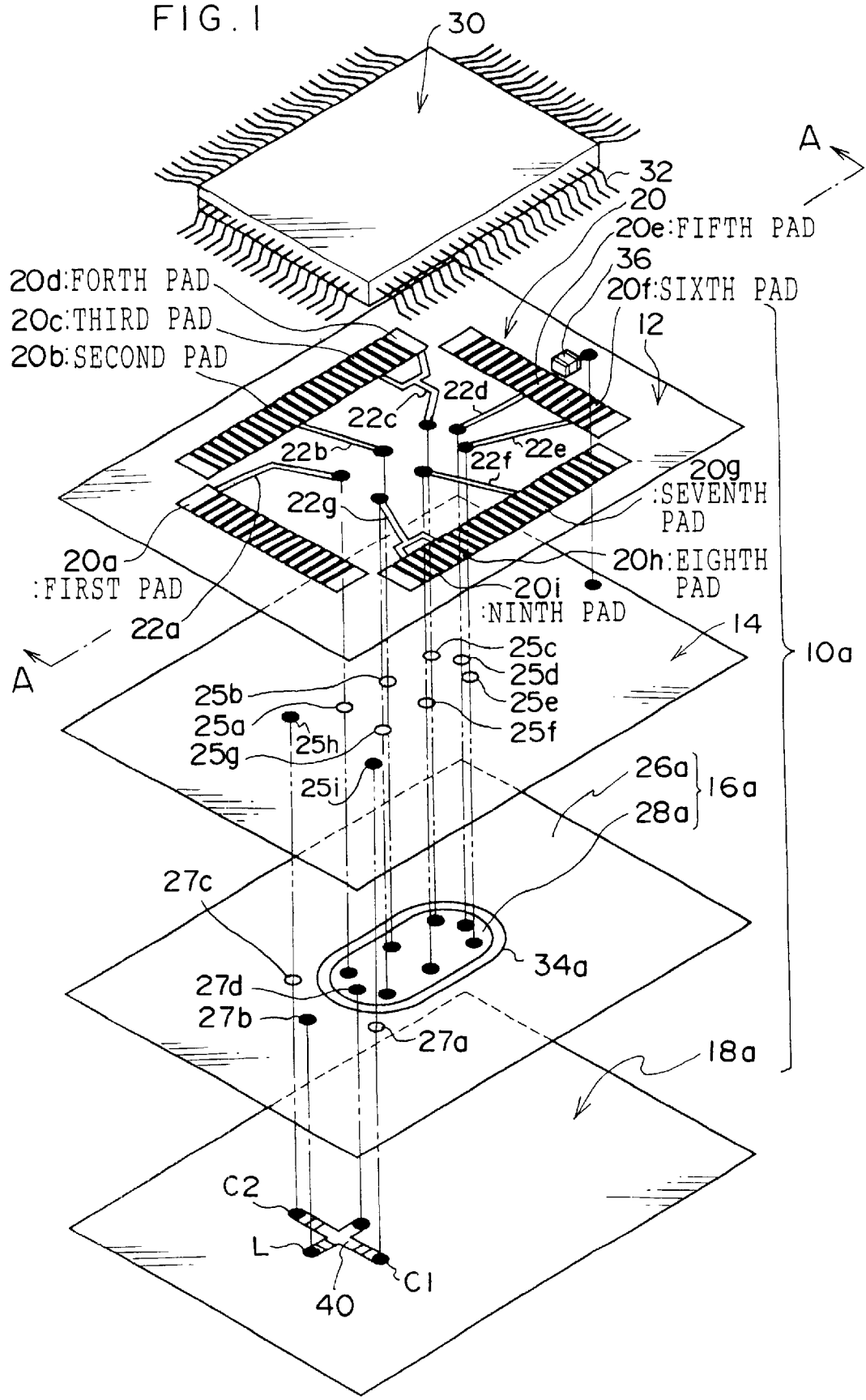
FIG. 1 is an exploded perspective view schematically showing an overall structure of a printed wiring board according to a first embodiment of the present invention.

The structure of a printed wiring board 10a according to a first embodiment will be described with reference to FIGS. 1–6. FIG. 1 schematically shows the printed wiring board 10a in a state in which its respective layers are separated, in order to clearly show the states of the respective layers thereof.

As shown in FIG. 1, the printed wiring board 10a of the present first embodiment comprises a first signal layer 12 which is one face side of the printed wiring board 10a, a GND layer 14, a power source layer 16a and a second signal layer 18a which is other face side of the printed wiring board 10a.

In the first signal layer 12, a plurality of pads 20, which are soldered with external terminals 32 of an IC 30 and electrically connected therewith, are provided so as to surround a rectangular region, so that an IC mounting face is formed. One end of a capacitor 36, the other end of which is grounded to the GND layer 14, and ones of ends of the power supply wires 22a–22g, the other ends of which are extended to become a layer above a sub-power source face 28a, are connected to a first pad 20a through a ninth pad 20i among the plural pads 20 for power supply which are provided on the first signal layer 12. For convenience of illustration, FIG. 1 shows that only a fifth pad 20e is connected to a capacitor 36, the other end of which is grounded to the GND layer 14, while other illustration is omitted. Of course, in all of the embodiments which will be described below, the capacitor 36, the other end of which is grounded to the GND layer 14, is provided for each of the first pad 20a—through a fourth pad 20d and a sixth pad 20f through the ninth pad 20i, and illustration thereof is omitted.

The capacitor 36 may be provided for each of the first pad 20a through the ninth pad 20i for power supply as in the first embodiment, or may be provided on a predetermined number of the pads among the first pad 20a through the ninth pad 20i for power supply.

Figure 2:
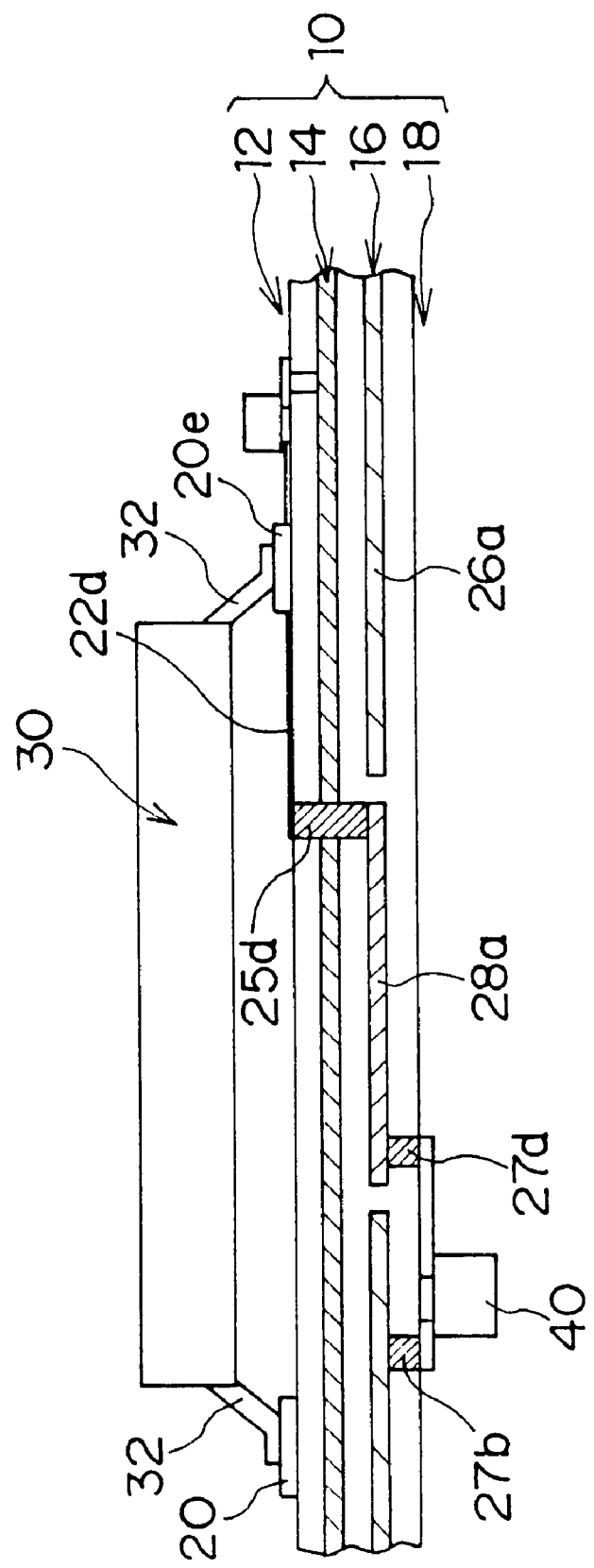
FIG. 2 is a sectional view taken along line A—A of FIG. 1.

As shown in FIGS. 1 and 2, the other ends of the power supply wires 22a–22g are connected to via holes 25a–25g. These via holes 25a–25g pass through the GND layer 14 such that they are not connected therewith, and are connected to the sub-power supply face 28a described later. The power supply wires 22a–22g correspond to auxiliary wires of the present invention, and the via holes 25a–25g correspond to layer connecting members forming an electromagnetic field separating portion of the present invention.

The power source layer 16a is formed by the main power source face 26a and the sub-power source layer 28a. The main power source face 26a is connected to an AC power supply (not shown), and forms a common power source layer for the printed wiring board 10a, and has a substantially oval opening 34a which is smaller than the package size of the IC 30 to be mounted on the IC mounting face.

The sub-power source face 28a is provided on the same layer as the main power source face 26a. The sub-power source face 28a is formed in a substantially oval shape at a predetermined position in a substantially oval opening 34a in the main power source face 26a at a position set apart from the periphery of the opening 34a by a predetermined distance, such that the sub-power source face 28a is not in direct contact with the main power source face 26a.

This sub-power source face 28a is supplied with electric power from the main power source face 26a through an L-type filter 40. The main power source face 26a corresponds to a first power source region of the present invention, while the sub-power source face 28a corresponds to a second power source region of the present invention. In all of the embodiments of the present invention including the first embodiment, the main power source face 26a and the sub-power source face 28a are of patterns made of a conductive material formed in a predetermined shape.

Figure 3A:
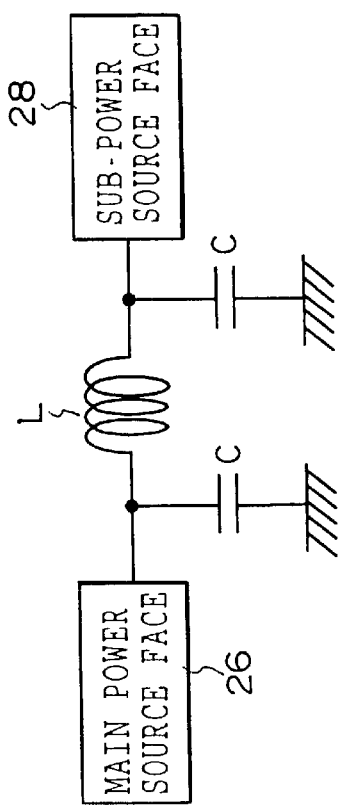
FIG. 3A is an electric block diagram of an L-type filter having L and C.

As shown in FIG. 3A, the second signal layer 18a has the L-type filter 40 formed by an inductor L which is a ferrite chip inductor and a capacitor C. In FIG. 1, the inductor L of the L-type filter 40 provided on the second signal layer 18a is connected to the main power source face 26a through the via hole 27b. Two capacitors C1, C2 are connected to the GND layer 14 through the via holes 27a, 27c which are not connected to the main power source face 26a. One terminal of the L-type filter 40 is connected to the sub-power source face 28a through a via hole 27d connected to the sub-power source face 28a. Consequently, when electric power is supplied from the main power source face 26a to the sub-power source face 28a, the high-frequency noise component is reduced.

That is, in the printed wiring board of the first embodiment, electric power, whose noise has been reduced, is supplied from the main power source face 26a to the sub-power source face 28a through the L-type filter 40, and is supplied to the first pad 20a—through the ninth pad 20i from the sub-power source face 28a through the via holes 25a–25g passing through the GND layer 14 and the power supply wires 22a–22g.

The respective first pad 20a—through the ninth pad 20i for power supply, or same of the pads thereamong, are provided with the capacitors 36, and the respective via holes 25a–25g act as inductor L. Thus, an L-type filter having L and, C or an L-type filter having L and C and an L-type filter having only L, are formed between the first pad 20a—through the ninth pad 20i for power supply and the sub-power source face 28a.

Figure 10:
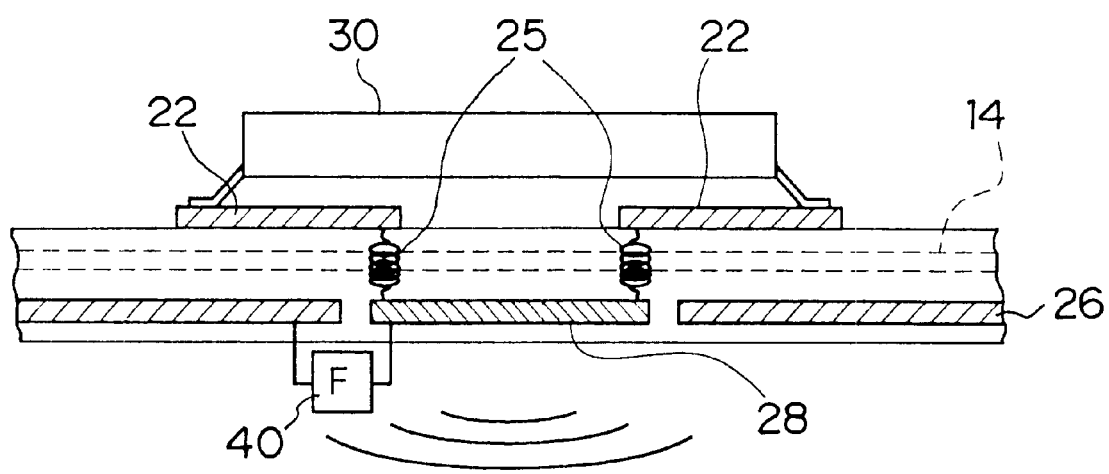
FIG. 10 is an explanatory diagram for explaining operation of the present invention.

That is, because the sectional area of the via hole is very small as compared to the area of the second power source region, the via hole makes it difficult for high-frequency noise component to pass therethrough. As a result, as shown in FIG. 10, the via hole 25 (layer connecting member) functions as the inductor L. (FIG. 10 is an explanatory diagram for explaining the principles of the present invention. In FIG. 10, reference numeral 14 denotes the GND layer, reference numeral 22 denotes a power supply wire which serves as an auxiliary wire, reference numeral 25 denotes the via hole, reference numeral 26 denotes the main power source face which serves as the first power source region, reference numeral 28 denotes the sub-power source face which serves as the second power source region, reference numeral 40 denotes the L-type filter which serves as a filter portion and reference numeral 30 denotes the IC which serves as the semiconductor device. Note that FIG. 10 is an example of the structure.)

Therefore, electric power, whose noise is reduced, is supplied to the first pad 20a—through the ninth pad 20i for power supply and then supplied to the external terminals 32 of the IC 30 connected to the first pad 20a—through the ninth pad 20i. It is permissible to not provide any of the first pad 20a—through the ninth pad 20i with the capacitor C. In this case, the L-type filter having only L is formed between the first pad 20a—through the ninth pad 20i for power supply and the sub-power source face 28a.

Because the GND layer 14 is provided between the first signal layer 12 and the power source layer 16a such that it is adjacent to both, magnetic flux terminates between the first signal layer 12 and the GND layer 14, and magnetic flux also terminates between the power source layer 16a and the GND layer 14. As a result, an electromagnetic field is separated between the first signal layer 12 and the power source layer 16a. Thus, even if the first signal layer 12 and the power source layer 16a become sources of radiation of noise, the first signal layer 12 and the power source layer 16a do not generate a large radiation noise together. Therefore, the radiation noise can be kept to a low level. That is, the radiation noise can be largely reduced.

Further, because the power supply wires 22a–22g are provided on the first signal layer 12, the current propagation loop formed by an electrode pad (not shown) on the semiconductor chip in the IC, the first pad 20a through the ninth pad 20i, the power supply wires 22a–22g, the via holes 25a–25g and the sub-power source face 28a is reduced in size, so that noise radiated from this propagation loop can be reduced.

The power supply wires 22a–22g may be provided as an inner layer of the printed wiring board 10a or at the second signal layer 18a which is located at the rear face side of the printed wiring board 10a. In this case, the power supply wires 22a–22g may be connected to the first pad 20a through the ninth pad 20i through the via holes.

Figure 11A:
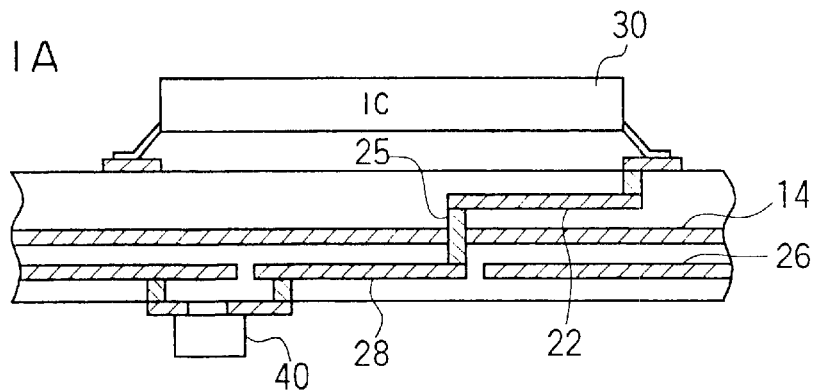
FIGS. 11A to 11D are explanatory diagrams for explaining a structural example of the present invention.
Figure 11B:
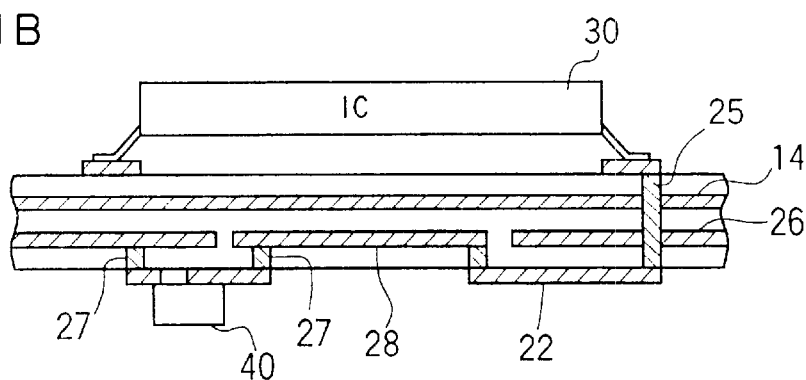
Figure 11C:
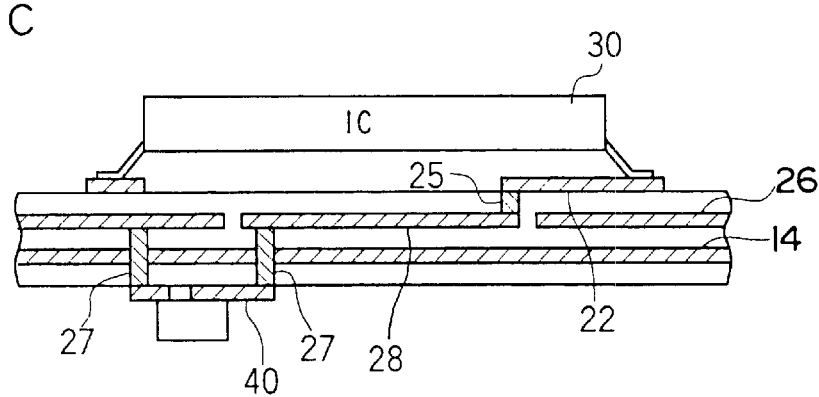
Figure 11D:
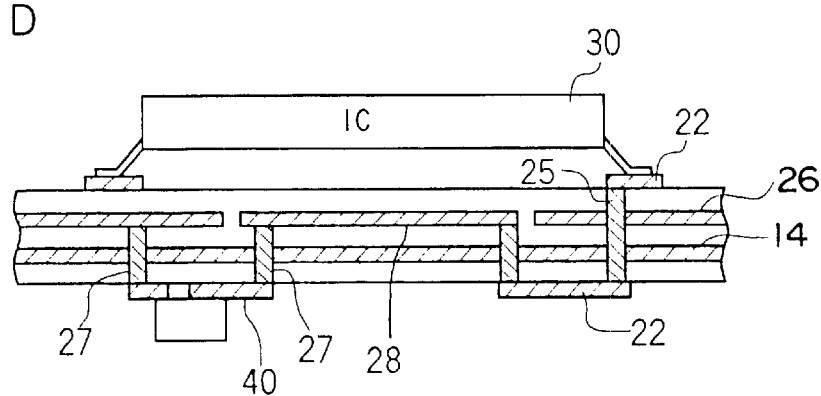

For example, the power supply wires may be provided on a mounting face of the printed wiring board as shown in FIGS. 2 and 11C, or inside the printed wiring board as shown in FIG. 11A or on the face opposite to the mounting face as shown in FIGS. 11B and 11D. (FIGS. 11A to 11D are explanatory diagrams for explaining the principles of the present invention, and the same reference numerals as those of FIG. 10 are used therein. Of course, the structure shown in FIGS. 11A to 11D are examples.)

Figure 3B:
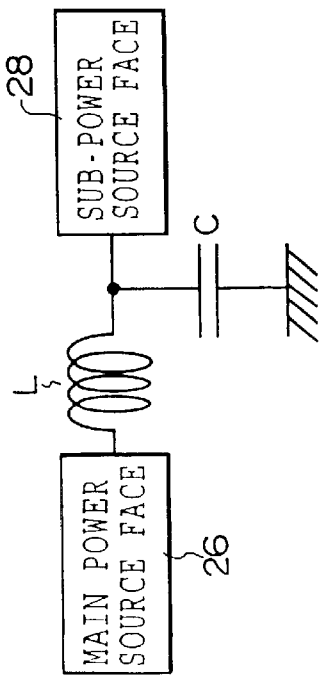
FIG. 3B is an electric block diagram of a π-type filter having C, L and C.
Figure 3C:
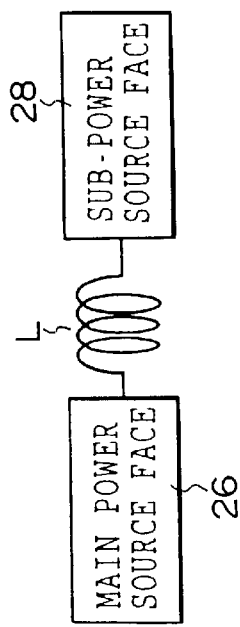
FIG. 3C is an electric block diagram of a filter formed by only an inductor L.

According to the first embodiment, the main power source face 26a and the sub-power source face 28a are connected to each other by means of the L-type filter. However, the connecting means is not restricted to an L-type filter, and it is permissible to use the π-type filter having C, L, C as shown in FIG. 3B or an ordinary low-pass filter such as a filter formed only by an inductor L as shown in FIG. 3C. FIG. 3C shows an L-type filter through stray capacitance. Not only an inductor which is reactance component, but also an inductor having resistance component such as a ferrite chip inductor may be used as the L.

Figure 4:
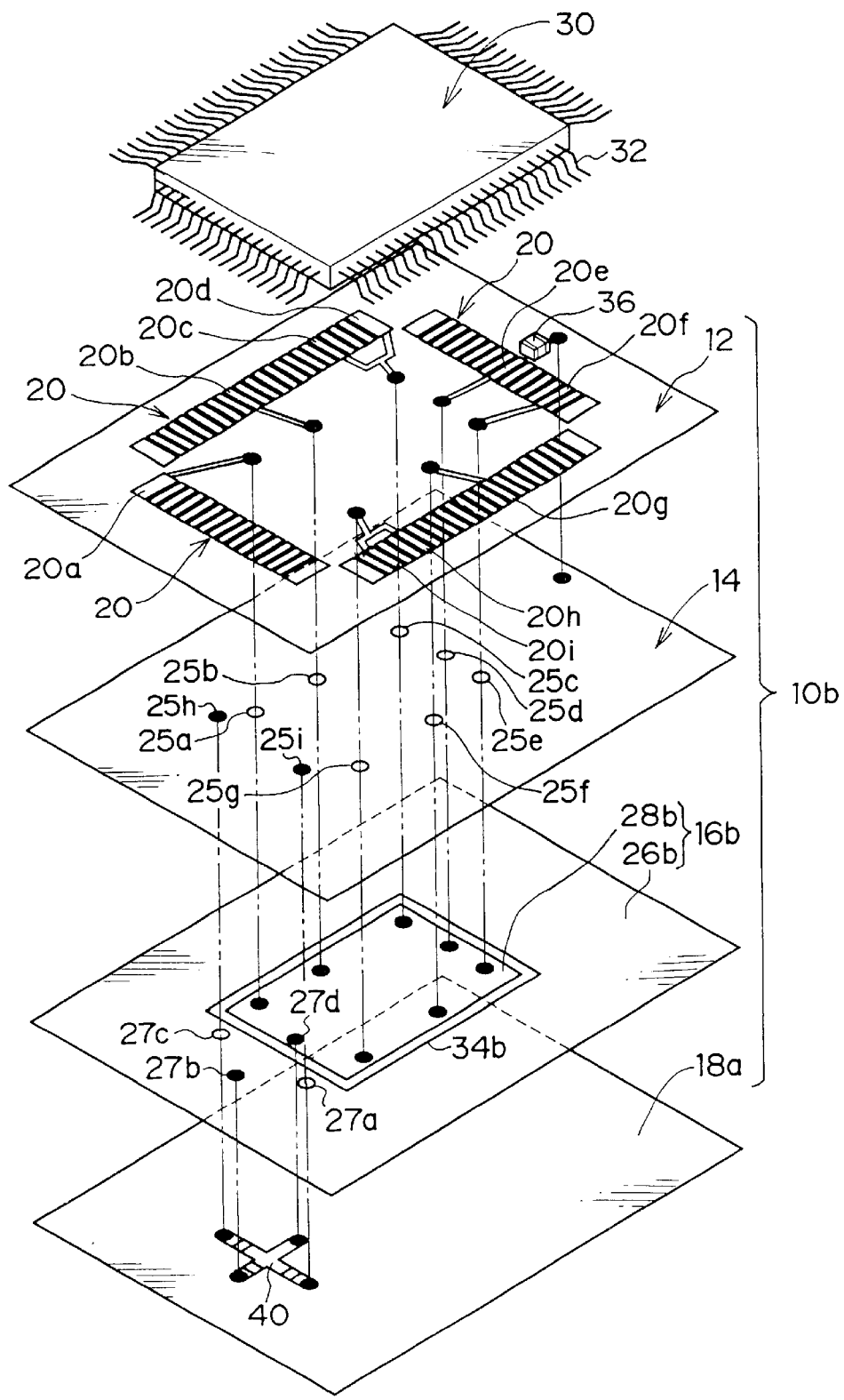
FIG. 4 is an exploded perspective view schematically showing an overall structure of a printed wiring board according to an applied example of the first embodiment.

As an applied example of the first embodiment, a printed wiring board 10b is formed as follows as shown in FIG. 4. A rectangular opening 34b, which is smaller than the package size of the IC 30 to be mounted on the IC mounting face and larger than the semiconductor chip (not shown) within the IC 30, is provided in a main power source face 26b. A sub-power source face 28b, which is provided within this opening 34b such that it is not in direct contact with the main power source face 26a, is rectangular, is smaller than the package size of the IC 30, and is larger or smaller than the semiconductor chip (not shown) in the IC 30.

Figure 5:
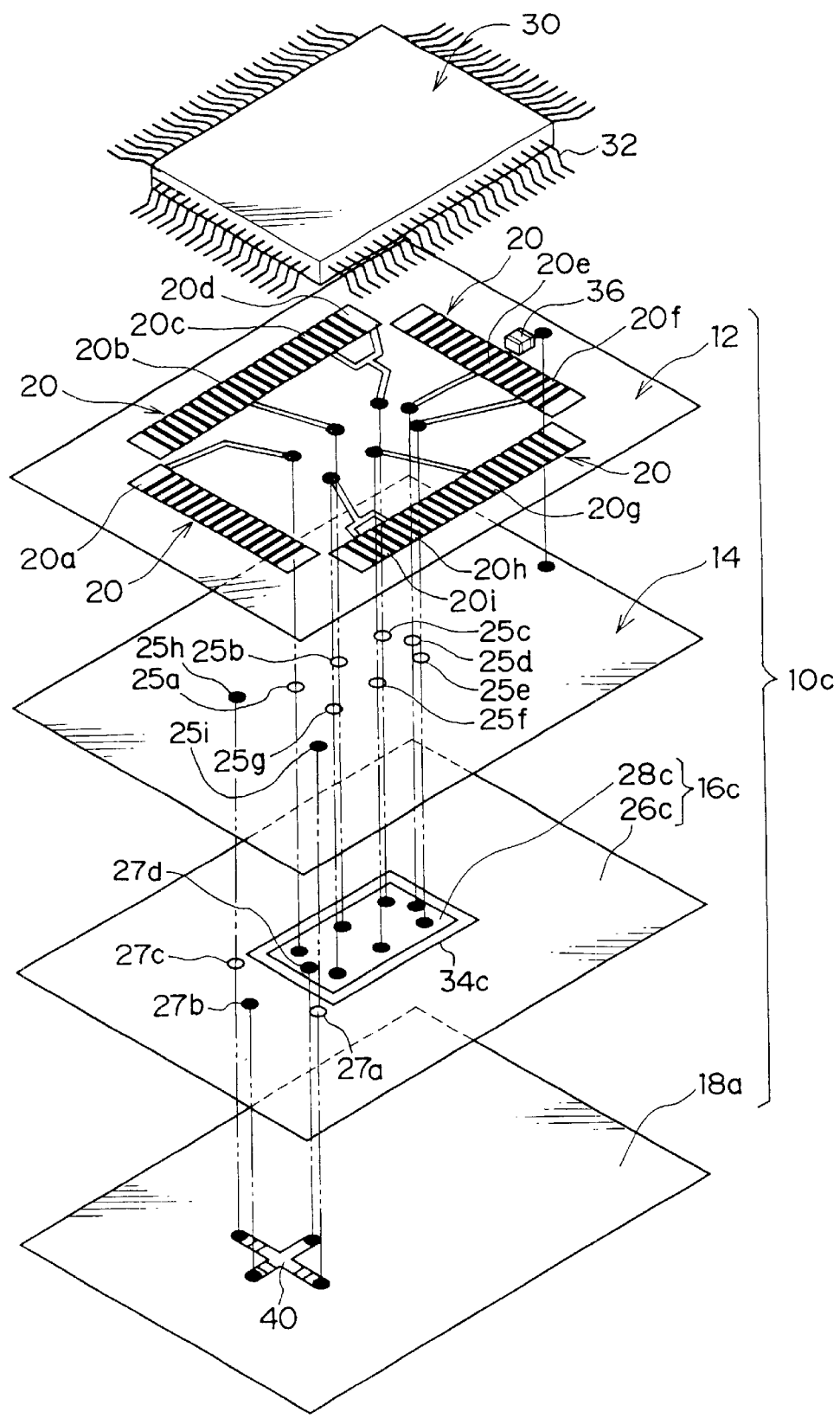
FIG. 5 is an exploded perspective view schematically showing an overall structure of a printed wiring board according to another applied example of the first embodiment.

Further, a printed wiring board 10c shown in FIG. 5 may be used in which a rectangular opening 34c provided in a main power source face 26c is of substantially the same size as the semiconductor chip (not shown) in the IC 30 mounted on the IC mounting face, and a sub-power source face 28c in the opening 34c is of substantially the same size as the semiconductor chip (not shown). Because the other structures are the same as those of the above described first embodiment, description thereof is omitted.

Figure 6:
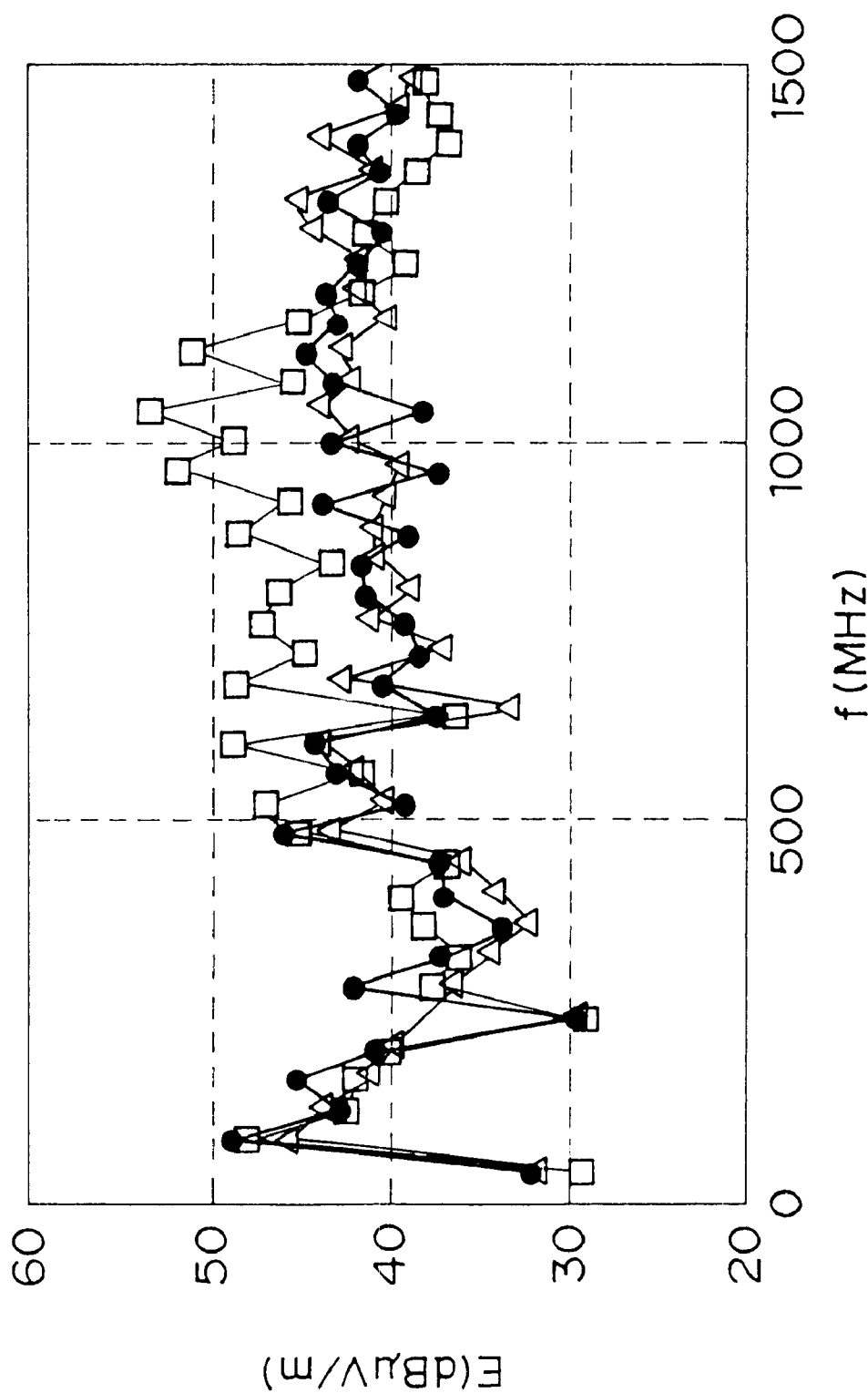
FIG. 6 is a graph showing measurement results of electromagnetic field spectra radiated when the printed wiring board shown in FIGS. 1 and 2, the printed wiring board shown in FIG. 4 and the printed wiring board shown in FIG. 12, each provided with an IC, are driven.

FIG. 6 shows measurement results of a radiation electromagnetic spectrum when the IC 30 operating at a 40-MHz clock is mounted on the printed wiring board 10a shown in FIGS. 1, 2 and driven, and measurement results of a radiation electromagnetic spectrum when the IC 30 operating at a 40-MHz clock is mounted on the printed wiring board 10b and driven. The sub-power source face 28b of the printed wiring board 10b shown in FIG. 4 is larger than the sub-power source face 28a provided at the printed wiring board 10a shown in FIGS. 1, 2.

Figure 12:
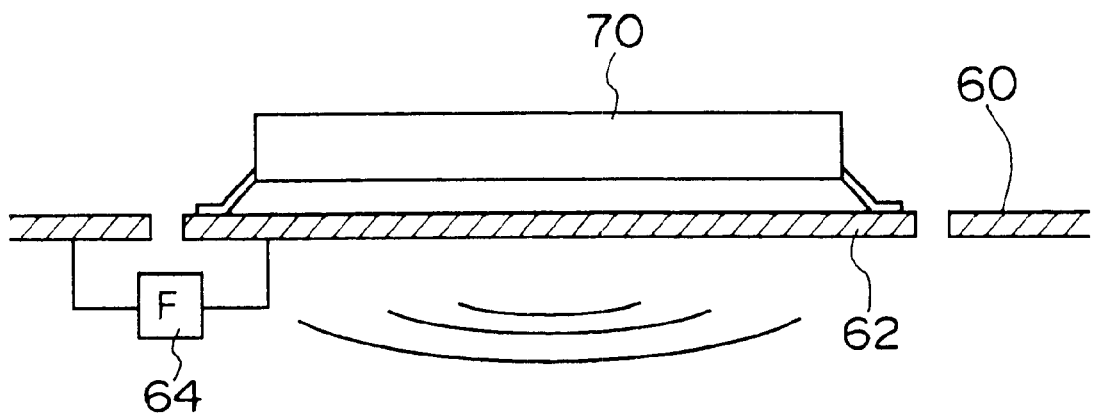
FIG. 12 is a sectional view schematically showing the structure of a conventional printed wiring board.

As a comparative example, FIG. 6 shows measurement results of a radiation electromagnetic spectrum when the IC 30 having the same structure is mounted on the printed wiring board of a conventional structure shown in FIG. 12 and driven. In FIG. 6, the graphed line connecting the black circles indicates measurement results when the printed wiring board 10a shown in FIGS. 1, 2 is used, the graphed line connecting the white triangles indicates the measurement results when the printed wiring board 10b shown in FIG. 4 is used, and the graphed line connecting the white squares indicates the measurement results when the printed wiring board of the conventional structure shown in FIG. 12 is used.

From these measurement results, it is evident that the printed wiring board 10a shown in FIGS. 1, 2 and the printed wiring board 10b shown in FIG. 4 where the present invention is applied, generate a much smaller amount of high-frequency noise component of 500 MHz or more as compared to the printed wiring board having the conventional structure.

Although, according to the first embodiment, a case where the main power source face 26a–26c and the sub-power source face 28a–28c are formed on the same layer has been described, the present invention is not restricted to this structure. It is permissible to provide the main power source face 26a–26c and the sub-power source face 28a–28c on separate layers. In this case, the main power source face 26a–26c and the sub-power source face 28a–28c may be formed on separate layers, or the main power source face 26a–26c and the sub-power source face 28a–28c may be provided on separate layers while the main power source face 26a–26c contains no opening 34a–34c.

In case where the main power source face 26a–26c contains no opening 34a–34c, the sub-power source face 28a–28c may be provided as the layer above the main power source face 26a–26c or as the layer below the main power source face 26a–26c. In any case, the sub-power source face 28a–28c should be connected to the main power source face 26a–26c through the filter 40.

(Second Embodiment)

Next, the structure of a printed wiring board 10d according to the second embodiment will be described with reference to FIG. 7. The printed wiring board 10d of the second embodiment is an applied example of the first embodiment and differs from the first embodiment only with respect to the structure of the power source layer. Thus, a description of the same portions is omitted and only different portions will be described.

Figure 7:
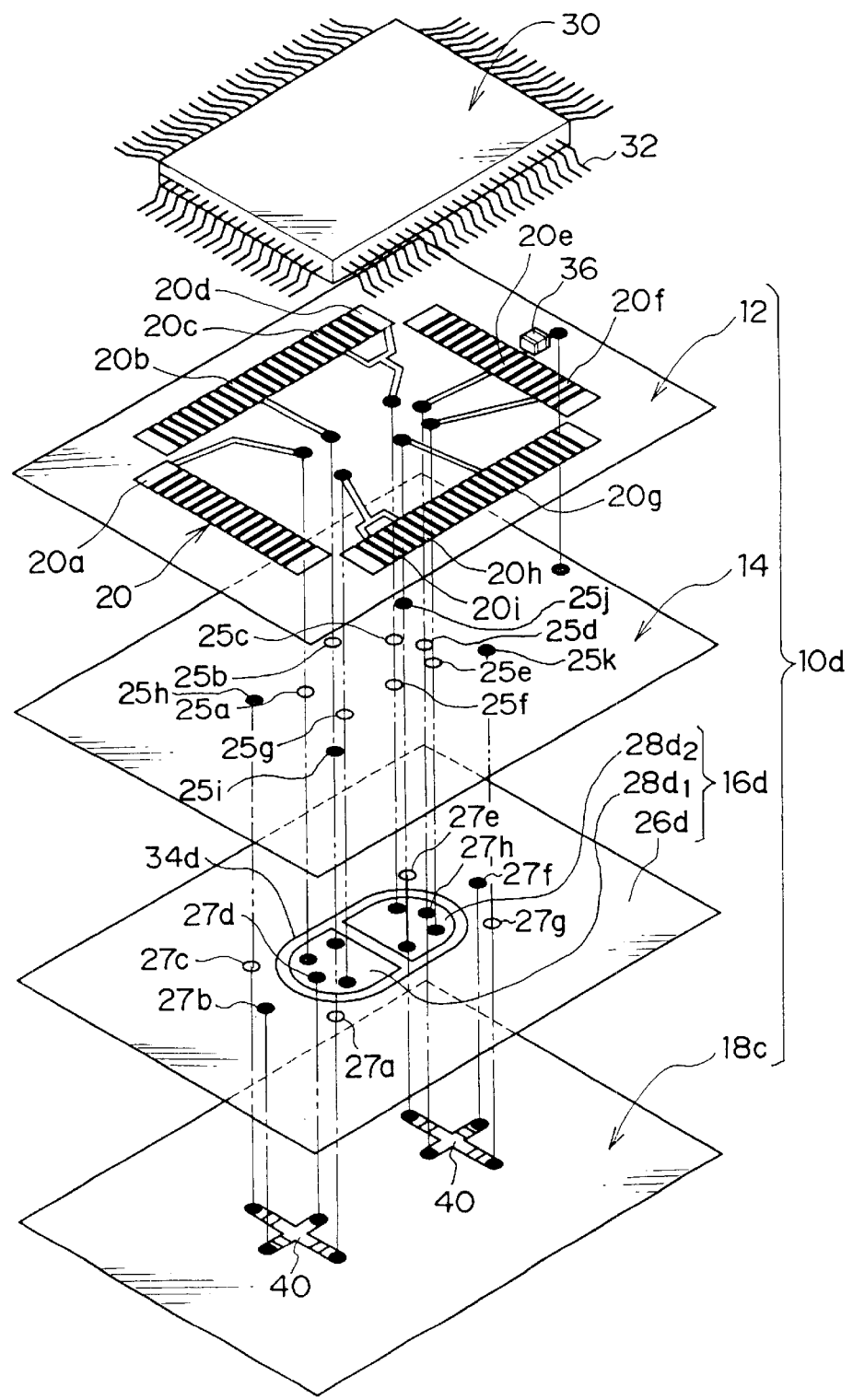
FIG. 7 is an exploded perspective view schematically showing the overall structure of a printed wiring board according to a second embodiment of the present invention.

As shown in FIG. 7, the printed wiring board 10d of the second embodiment has two sub-power source faces 28d1, 28d2 in an opening 34d provided in a main power source face 26d which forms a power source layer 16d.

The two sub-power source faces 28d1, 28d2 are provided separately such that they are not in contact with each other, and are located a predetermined distance from the periphery of the opening 34d of the main power source face 26d. The two sub-power source faces 28d1, 28d2 are connected to capacitors 36 provided on the first signal layer 12. Because the two sub-power source faces 28d1, 28d2 are electrically separated from each other, electric power of the same voltages can be supplied to the sub-power source faces, or electric power of different voltages can be supplied thereto. The main power source face 26d corresponds to the first power source region of the present invention, and the sub-power source faces 28d1, 28d2 correspond to the second power source region of the present invention.

Because the printed wiring board 10d of the second embodiment has such a structure, in addition to the effects described in connection with the first embodiment, there is the effect that dispersion of noise between two sub-power sources is eliminated, thereby making it possible to reduce radiated noise.

(Third Embodiment)

The structure of a printed wiring board 10e according to a third embodiment will be described with reference to FIG. 8. The printed wiring board 10e of the third embodiment is an applied example of the first embodiment, and differs from the first embodiment only with respect to the structure of the power source layer. Therefore, a description of the same portions is omitted and only different portions will be described.

Figure 8:
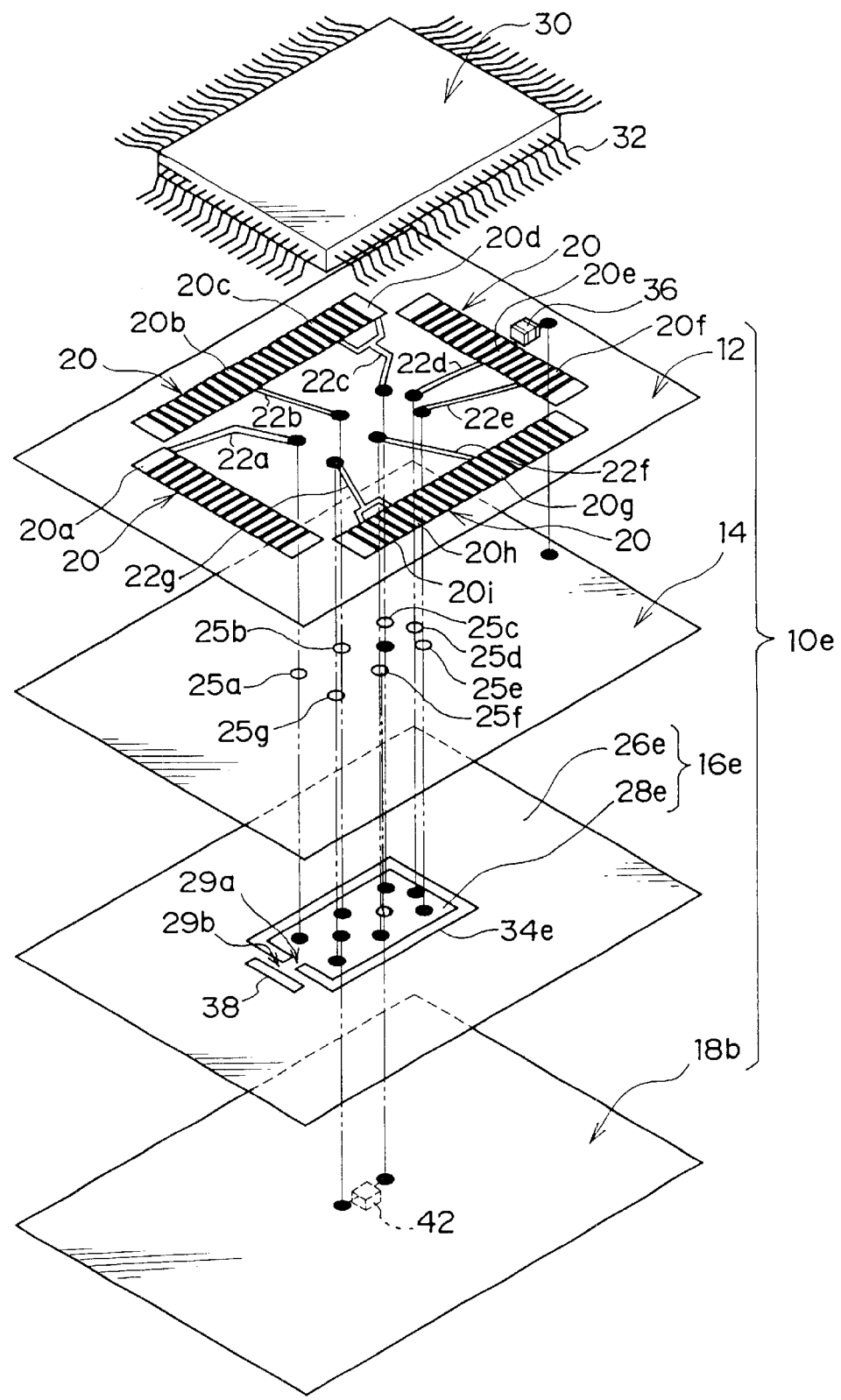
FIG. 8 is an exploded perspective view schematically showing the overall structure of a printed wiring board according to a third embodiment of the present invention.

As shown in FIG. 8, in the printed wiring board 10e according to the third embodiment, a main power source face 26e forming a power source layer 16e is connected to an AC power source (not shown), and forms a common power source layer of the printed wiring board 10e. The main power source face 26e has a rectangular opening 34e having substantially the same area as the size of a semiconductor chip (not shown) stored in the IC 30 to be mounted on the IC mounting face.

The sub-power source face 28e forming the power supply layer 16e is provided in a rectangular shape at a predetermined position within the opening 34e, and is apart from the periphery of the opening 34e by a predetermined distance in the main power source face 34e, and is connected to a capacitor 42 provided on the second signal layer 18b. The main power source face 26e corresponds to the first power source region of the present invention, and the sub-power source face 28e corresponds to the second power source region of the present invention.

According to the third embodiment, a portion of the periphery of the sub-power source face 28e is joined to a portion of the periphery of the opening 34e in the main power source face 26e through a connection region 29a which forms a filter portion. A long groove 38 is formed along the opening 34e in the main power source face 26e. This long groove 38 forms a narrow conductive path 29b which is connected to the connection region 29a and forms a filter portion. Because this narrow conductive path 29b serves as an inductor, the high-frequency noise component is reduced when electric power from the main power source face 26e passes through the narrow conductive path 29b. Further, together with the capacitor 42 mounted on the second signal layer 18b, the narrow conductive path 29b act as a filter portion for reducing noise.

In the printed wiring board 10e of the third embodiment, the main power source face 26e and the sub-power source face 28e are formed by patterns which function as a filter. Therefore, in addition to the effects of the first embodiment, there is the effect that, because there is no need to provide a filter, the entire thickness can be reduced and production costs can be reduced.

Although according to the third embodiment, a single connection region is provided, the number of connection regions is not restricted to one, and plural connection regions may be provided. In this case, electric power is supplied to the respective connection regions through narrow conductive paths formed by long grooves or the like. Further, it is possible to use a known method for providing the pattern with the operation of an inductor or a filter by forming the narrow conductive path in a meandering shape.

(Fourth Embodiment)

Next, the structure of a printed wiring board 10f according to the fourth embodiment will be described with reference to FIG. 9. The printed wiring board 10f of the fourth embodiment is an applied example of the first embodiment, and differs from the first embodiment only with respect to the structure of the first signal layer 13, the structure of the second signal layer 18c, the dimension of the opening in a main power source face 26f, and the dimension of a sub-power source face 28f. Thus, description of the same portions is omitted, and only different portions will be described.

Figure 9:
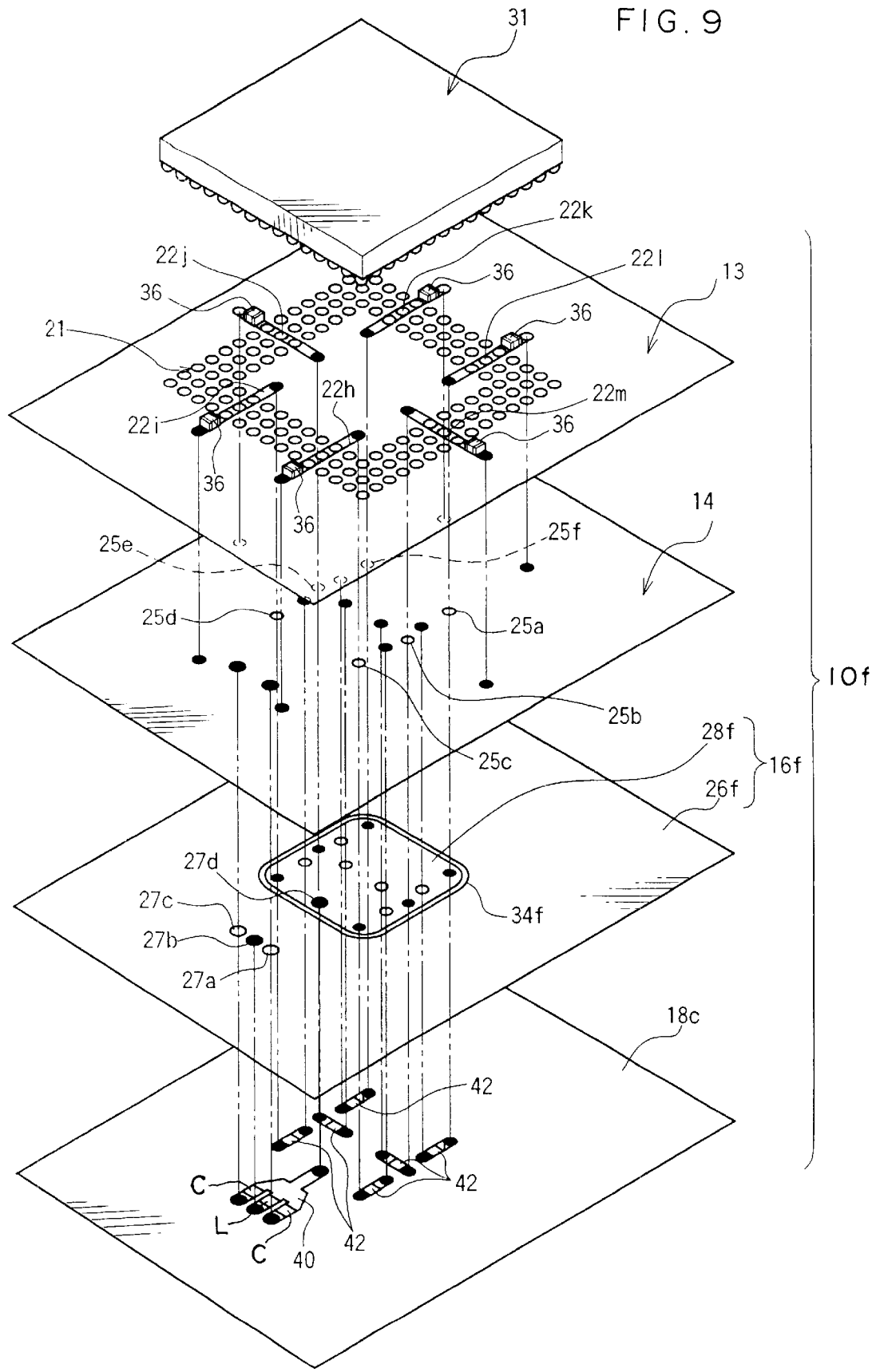
FIG. 9 is an exploded perspective view schematically showing the overall structure of a printed wiring board according to a fourth embodiment of the present invention.

As shown in FIG. 9, the printed wiring board 10f of the fourth embodiment is suitable for a ball grid array (BGA) IC 31 to be placed thereon. The first signal layer 13 has electrode pads 21 provided at positions corresponding to external terminals of the BGA IC 31 to be placed on the printed wiring board 10f. In FIG. 9, three rows of the electrode pads 21 are provided along each of the four sides of the mounting face.

Power supply wires 22h–22m are provided on the surface of the first signal layer 13. Each of the power supply wires 22h–22m connects three electrode pads 21 aligned in the transverse direction of the electrode pads 21 disposed in array shape. These power supply wires 22h–22m are provided so as to be oriented in directions orthogonal to the four sides of the mounting face, from the outer side of the mounting face to the center thereof. Further, the capacitor 36 is provided at a mounting face outer side end of each of the power supply wires 22h–22m. A mounting face inner side end of each of the power supply wires 22h–22m is connected to a rear face of the printed wiring board, namely, to a capacitor 42, so that high-frequency current can be stably.

The second signal layer 18c contains the capacitors 42 which are connected to the mounting face inner side ends of the power supply wires 22h–22m. The ends of each capacitor 42 are not connected to the GND layer 14. The capacitor 42 is connected to via holes 25a–25f which connect the sub-power source face 28f and the inner side ends of the power supply wires 22h–22m.

Because the printed wiring board 10f of the fourth embodiment has the above described structure, it produces the same effects as the first embodiment even when the BGA IC 31 is placed thereon. Further, because the capacitors 36, 42 are provided at both ends of the power supply wires 22h–22m, a further noise reduction effect is obtained, so that electric power can be supplied stably.

In the printed wiring boards 10a–10f of the first through fourth embodiments of the present invention, the GND layer 14 is provided between the first signal layer 12 and the power supply layer 16a–16d. However, the present invention is not restricted to this structure. For example, the GND layer 14 may be provided between the power source layer and the second signal layer. If the power source layer is formed by the main power source face and the sub-power source face which are provided on separate layers, GND layer 14 may be provided in a one-to-one correspondence with the main power source face and the sub-power source face such that a GND layer 14 is provided adjacent to the main power source face and a GND layer 14 is provided adjacent to the sub-power source face. Alternatively, the GND layer 14 may be provided between the main power source face and the sub-power source face.

The GND layer 14 may be provided above and adjacent to the second power source region (sub-power source face 28) as shown in FIGS. 11A, 11B or under and adjacent to the second power source region (sub-power source face 28) as shown in FIGS. 11C, 11D.

Preferably, if a GND layer 14 is provided adjacent the auxiliary wire (power supply wire 22) and a GND layer 14 is provided adjacent the second power source region (sub-power source face 28), magnetic flux terminates between the semiconductor device and the GND layer, and at the same time, magnetic flux terminates between the second power source region and the GND layer. As a result, the semiconductor device and the second power source region can be separated from each other electromagnetically, so that the electromagnetic field is stabilized. Therefore, propagation of radiation noise from the second power source region to the semiconductor device can be prevented, so that the semiconductor device and the second power source region can be integrated electromagnetically, and radiation of noise can be suppressed.

Further, by disposing the GND layer 14 between the auxiliary wire (power supply wire 22) and the second power source region (sub-power source face 28) so that the layer connecting member (via hole 25) passes through the GND layer 14 as shown in FIGS. 2, 11A and 11B, the layer connecting member (via hole 25) acts as inductor L, and the structure in which the layer connecting member (via hole 25) goes through the GND layer 14 serves as capacitor C. As a result, an L-type filter having L and C is substantially formed, thereby intensifying the noise reduction effect. Further, because the GND layer acts as a shield layer for separating electromagnetic fields above and beneath the GND layer, the effect of electromagnetic field separation is intensified.

In case in which the GND layer is provided between the auxiliary wire and the second power source region and that via hole passes through the GND layer, a single GND layer suffices. Thus, the layer structure of the printed wiring board can be simplified.

As described above, according to the present invention, low-frequency noise components supplied from the outside are reduced and high-frequency noise radiated from the second power source region can be also suppressed, thereby reducing radiation noise to a very low level overall.

Further, in accordance with the present invention, the electromagnetic field of the second power source region and the electromagnetic field of the semiconductor device can be separated. Thus radiation noise can be reduced.

Further, in accordance with the present invention, radiation noise leaking from the opening can be decreased considerably. Thus radiation noise can be reduced on the whole.

In accordance with the present invention, the current propagation loop is small, and thus, radiation noise can be reduced.

In accordance with the present invention, the necessity for a space for providing the filter portion is eliminated, so that the structure can be simplified and cost of parts for the filter portion can be eliminated.

What is claimed is:

1. A printed wiring board for supplying electric power from an external power source to a semiconductor device, wherein the semiconductor device has a plurality of input power supply terminals for inputting substantially equal voltages to the semiconductor device, the printed wiring board comprising:
   (a) a plurality of layers, the layers including:
      (i) a mounting face having a plurality of electrical terminals, the mounting face being adapted for mounting the semiconductor device thereto with the plurality of semiconductor device power supply terminals electrically connected to the mounting face electrical terminals; and
      (ii) another layer having a first power source region adapted for connection to the external power source; and
   (b) a second power source region having an outer configuration smaller than an outer configuration of the semiconductor device, electrically insulated from the first power source region except through an electrical connection through a filter, and electrically connected to the mounting face electrical terminals for supplying electrical power received from the first power source region through the filter, to the semiconductor device.

2. The printed wiring board of claim 1, wherein the second power source region includes a plurality of areas that are electrically insulated from one another.

3. The printed wiring board of claim 1, wherein the second power source region is included in one of the layers, another layer includes auxiliary wires which supply electrical power received from the second power source region to the mounting face electrical terminals, first electrical connections connecting the second power source region to the auxiliary wires, second electrical connection connecting the plurality of input power supply terminals and auxiliary wires to one another, and an electromagnetic field separating portion through which at least one of the first and second electrical connections extends.

4. The printed wiring board of claim 3, wherein the plurality of layers includes a ground layer forming a part of the electromagnetic field separating portion, and said at least one of the electrical connections extends through the ground layer.

5. The printed wiring board of claim 3, wherein each auxiliary wire includes opposite ends with a capacitor at each end or both ends thereof.

6. The printed wiring board of claim 4, wherein the ground layer is provided adjacent the second power source region, at one of below and above the second power source region.

7. The printed wiring board of claim 4, wherein the ground layer is provided between the auxiliary wires and the second power source region, and a layer connecting member passes through the ground layer.

8. The printed wiring board of claim 1, wherein the layer having the first power source region also includes the second power source region, and the first power source region has an opening with an area less than the semiconductor device, and the second power source region is located in the opening.

9. The printed wiring board of claim 8, wherein the semiconductor device is an integrated circuit component having a semiconductor chip incorporating an integrated circuit, and the second power source region has substantially the same area as the semiconductor chip of the integrated circuit component.

10. The printed wiring board of claim 3, wherein the auxiliary wires are included on the mounting face.

11. The printed wiring board of claim 1, wherein the filter includes:

a connecting portion connecting the first power source region and the second power source region to one another; and a narrow conductive path formed in the first power source region by a groove pattern for introducing electric power from the first power source region to the connecting portion.

12. A printed wiring board for supplying power from a power source to an integrated circuit component, wherein the integrated circuit component includes a plurality of input power supply terminals for inputting substantially equal voltages thereto, the printed wiring board comprising a substrate including:

a mounting surface having electrical contacts, and adapted for receiving the integrated circuit component on the mounting surface, with the power supply input terminals of the integrated circuit component electrically connecting to the mounting surface electrical contacts;

a first power source region having an opening of an area less than the integrated circuit component;

at least one second power source region provided in the opening independent from the first power source region, with the second power source region connected through a filter portion to the first power source region;

a ground layer; and auxiliary wires provided on the mounting surface, each auxiliary wire having opposite ends with one end connected to the mounting surface electrical contacts, and the other end connected to the second power source region through a layer connecting member passing through the ground layer.

13. The printed wiring board of claim 12, wherein the integrated circuit component includes a semiconductor chip incorporating an integrated circuit, and the second power source region has an area substantially the same as the semiconductor chip.

14. The printed wiring board of claim 12, wherein the second power source region includes a plurality of areas electrically independent of one another.

15. The printed wiring board of claim 12, wherein each auxiliary wire includes a capacitor at each end or both ends thereof.

16. The printed wiring board of claim 12, wherein the ground layer is located adjacent the second power source region, provided at one of below and above the second power source region.

17. The printed wiring board of claim 12, wherein the ground layer is provided between the auxiliary wires and the second power source region.

18. The printed wiring board of claim 12, wherein at least one of the layer connecting members passes through an electromagnetic field separating portion.

19. The printed wiring board of claim 18, wherein the ground layer forms part of the electromagnetic field separating portion.

20. The printed wiring board of claim 12, wherein the filter portion includes:

a connecting portion connecting the first power source region and the second power source region to one another; and a narrow conductive path formed in the first power source region by a groove pattern for introducing electric power from the first power source region to the connecting portion.

21. A method of reducing electromagnetic noise introduced into a semiconductor device from a power source for the semiconductor device, the method comprising the steps of:

(a) forming a power supply layer having a first power source region surrounding a second power source region electrically isolated from the first power source region, with the second power region having an area smaller than that of the semiconductor device;

(b) supplying power to the first power source region, and from the first power region to the second power region through a filter;

(c) mounting the semiconductor device over the power supply layer with a ground layer disposed between the semiconductor device and the power supply layer; and (d) supplying power to the semiconductor device through electrical connections extending from the second power source region through the ground layer to the semiconductor device.

* * * * *